(12) United States Patent
Wu et al.

(10) Patent No.: US 8,182,723 B2
(45) Date of Patent: May 22, 2012

(54) MULTI-CAVITY INJECTION MOLDING METHOD FOR FABRICATING SOLAR LENSES

(75) Inventors: Fu-Yuan Wu, Hsinchu County (TW); Wen-Hsiung Tsou, Hsinchu County (TW)

(73) Assignee: Advanced Green Energy Tech. Corp., Hsinchu County (TW)

( * ) Notice: Subject to any disclaimer, the term of this patent is extended or adjusted under 35 U.S.C. 154(b) by 155 days.

(21) Appl. No.: 12/820,361

(22) Filed: Jun. 22, 2010

(65) Prior Publication Data
US 2011/0309537 A1    Dec. 22, 2011

(51) Int. Cl.
*B29D 11/00* (2006.01)
(52) U.S. Cl. .......................... 264/1.7; 264/1.1
(58) Field of Classification Search ............ 264/1.1, 264/1.7, 1.31
See application file for complete search history.

(56) References Cited

U.S. PATENT DOCUMENTS

| | | | |
|---|---|---|---|
| 6,419,476 B1* | 7/2002 | Ouellette | 425/567 |
| 6,994,808 B2* | 2/2006 | Lee et al. | 264/1.21 |
| RE40,152 E * | 3/2008 | Maus et al. | 264/40.5 |
| 2007/0097249 A1* | 5/2007 | Korenaga | 348/335 |
| 2009/0284952 A1* | 11/2009 | Gomi et al. | 362/97.1 |
| 2010/0226022 A1* | 9/2010 | Shen et al. | 359/742 |
| 2010/0323105 A1* | 12/2010 | Hosoe | 427/162 |
| 2010/0327469 A1* | 12/2010 | Kuo et al. | 264/1.1 |
| 2011/0068358 A1* | 3/2011 | Kuo et al. | 257/98 |

* cited by examiner

*Primary Examiner* — Jill Heitbrink
(74) *Attorney, Agent, or Firm* — Rosenberg, Klein & Lee

(57) ABSTRACT

The present invention discloses a multi-cavity injection molding method for fabricating solar lenses, which comprises steps: providing a mold set including a female mold and a male mold corresponding to the female mold, wherein the female mold has a receiving recess, and wherein the male mold has several lens cavities each having a lens pattern and connected with a cold runner; placing a glass substrate inside the receiving recess; injecting a silica gel to all the lens cavities via the cold runners; and heating the mold set to cure the silica gel, whereby to form several silica-gel lenses on the glass substrate in a single fabrication process. The present invention can effectively shorten the fabrication time and increase lens alignment.

10 Claims, 3 Drawing Sheets

MULTI-CAVITY INJECTION MOLDING METHOD FOR FABRICATING SOLAR LENSES

BACKGROUND OF THE INVENTION

1. Field of the Invention

The present invention relates to a method for fabricating solar lenses, particularly to a multi-cavity injection-molding method for fabricating solar lenses.

2. Description of the Related Art

Various substitute energies have been developed to confront the problem of exhausting fossil fuels, including solar power, wind power, hydraulic power, geothermal power, etc. Because solar energy is stable environment-friendly, eternally-sustainable and spread everywhere, it has been one of the most promising substitute energies. There have been various schemes to harness solar energy, including a light-concentration solar cell that can converts solar energy into electric energy.

A light-concentration solar cell includes a group of solar chips and a group of solar lenses arranged above the solar chips. The solar lens is a Fresnel lens able to focus sunlight on the solar chip, whereby is increased the power-generation efficiency.

The conventional Fresnel lenses for solar cells are fabricated with a four-cavity injection mold. The conventional technology is hard to control the molding conditions and has problems of uneven stress and thickness. Further, the Fresnel lens fabricated with the conventional technology is fragile and likely to deteriorate and have scratches.

In another conventional technology, a Fresnel lens is made of an acrylic material and stuck to a glass surface with adhesive. However, the conventional technology has the following disadvantages:
1. Sticking lenses is time-consuming and likely to generate bubbles.
2. The positions of lenses are hard to control.
3. As the position of a lens is hard to accurately control, the position of the solar chip below the lens needs to be adjusted. Adjusting solar chips are also time-consuming.
4. After the lenses have been stuck to a piece of glass, they need baking. Thus, the fabrication process takes too much time.

Accordingly, the present invention proposes a multi-cavity injection molding method for fabricating solar lenses to solve the above-mentioned problems.

SUMMARY OF THE INVENTION

The primary objective of the present invention is to provide a multi-cavity injection molding method for fabricating solar lenses, which adopts an embedding-type injection molding method to form several lenses in a single fabrication process, and which can shorten the fabrication time and promote the alignment precision of lenses effectively.

Another objective of the present invention is to provide a multi-cavity injection molding method for fabricating solar lenses, which can improve the deterioration-resistance, UV-resistance and impact-resistance of solar lenses.

To achieve the abovementioned objectives, the present invention proposes a multi-cavity injection molding method for fabricating solar lenses, which comprises steps: providing a mold set including a female mold and a male mold corresponding to the female mold, wherein the female mold has a receiving recess, and wherein the male mold has several lens cavities each having a lens pattern and connected with a cold runner; placing a glass substrate inside the receiving recess; injecting a silica gel to all the lens cavities via the cold runners; and heating the mold set to cure the silica gel, whereby to form several silica-gel lenses on the glass substrate.

Below, the embodiments are described in detail to make easily understood the objectives, technical contents, characteristics and accomplishments of the present invention.

DETAILED DESCRIPTION OF THE INVENTION

The present invention proposes a multi-cavity injection molding method for fabricating solar lenses, which adopts an embedding-type injection molding method to form several lenses in a single fabrication process, whereby are solved the problems of the time-consuming fabrication process and poor lens alignment of the conventional technology.

The present invention adopts a silica gel as the material of lenses to improve the deterioration-resistance, UV-resistance and impact-resistance of solar lenses.

Figure 1:
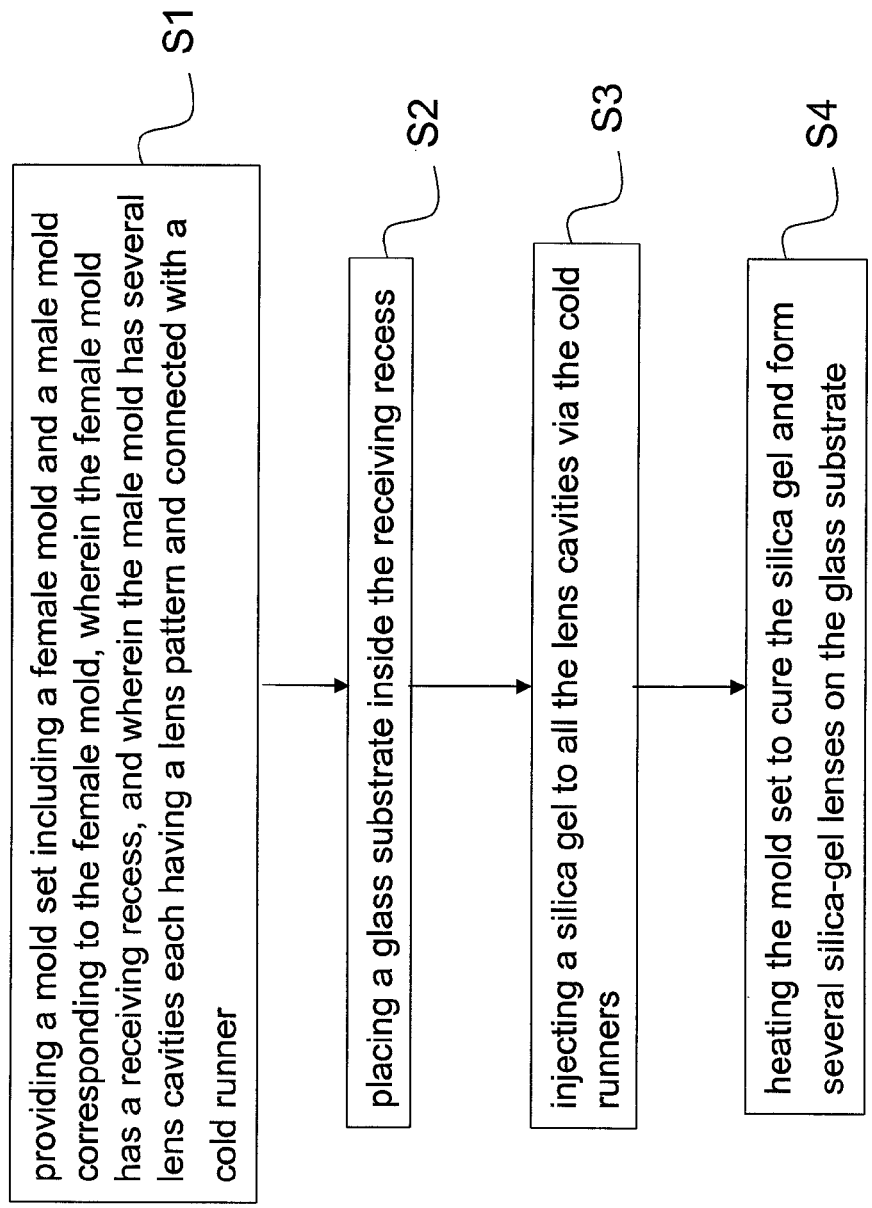
FIG. 1 is a flowchart of a multi-cavity injection molding method for fabricating solar lenses according to the present invention.
Figure 2:
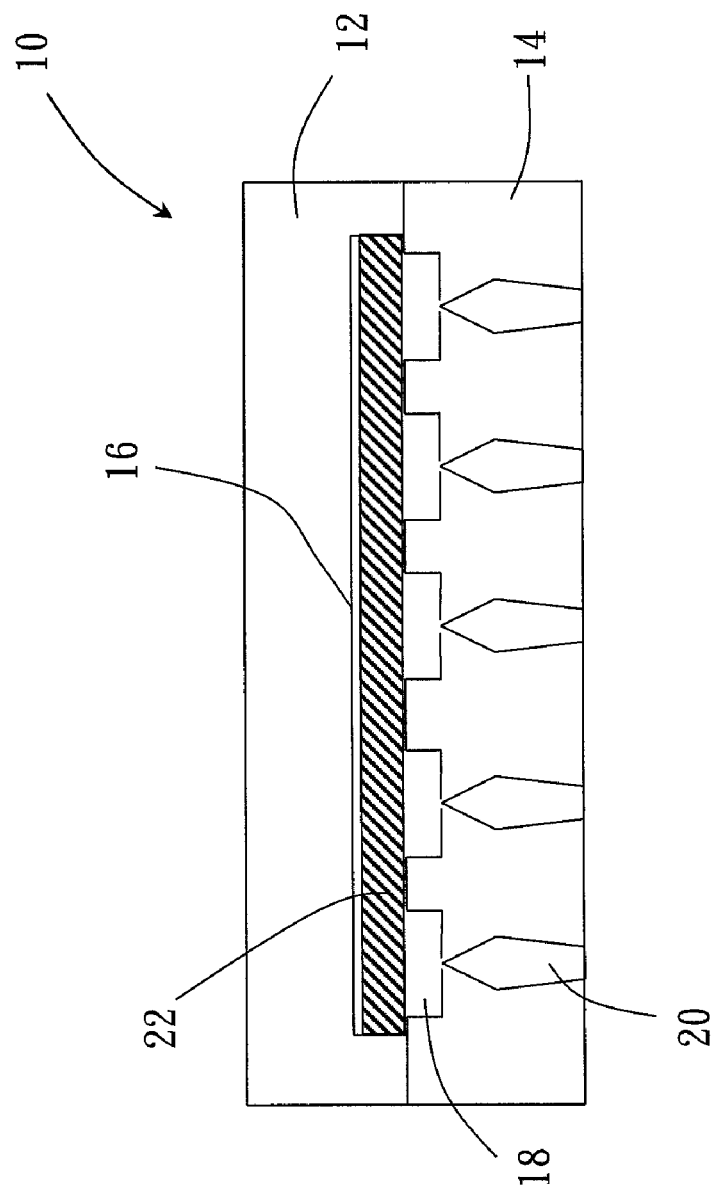
FIG. 2 is a diagram schematically showing the structure of a mold set according to the present invention.
Figure 3:
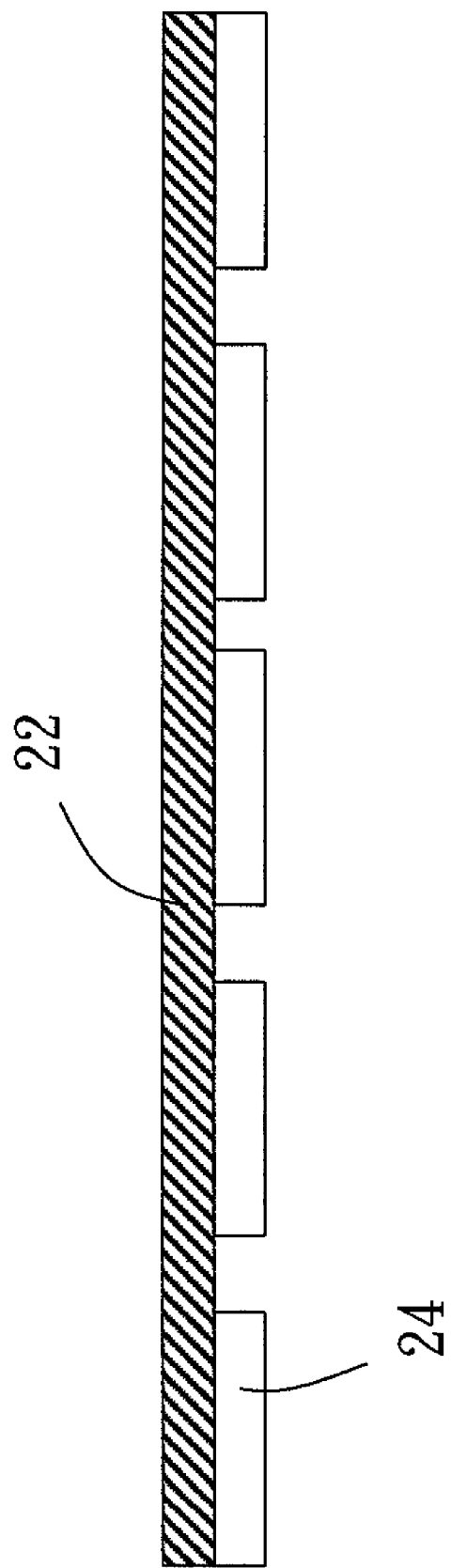
FIG. 3 is a sectional view schematically showing the solar lenses fabricated according to the present invention.

Refer to FIG. 1 and FIG. 2. FIG. 1 is a flowchart of a multi-cavity injection molding method for fabricating solar lenses according to the present invention. FIG. 2 is a diagram schematically showing the structure of a mold set according to the present invention. In Step S1, provide a mold set 10, including a female mold 12 and a male mold 14 corresponding to the female mold 12. The female mold 12 has a receiving recess 16. The male mold 14 has several lens cavities 18 each having a lens pattern. Each lens cavity 18 is corresponding to the receiving recess 16 and connects with a cold runner 20. The lens pattern is to form a Fresnel lens. In Step S2, place a glass substrate 22, such as a piece of tempered glass, inside the receiving recess 16, and close the female mold 12 and the male mold 14. In Step S3, inject a silica gel to all the lens cavities 18 via the cold runners 20, wherein the injection molding machine has an injection-compression stroke of 250 mm, an injection rate of 143 cm/sec, a maximum injection pressure of 479 kg/cm$^2$. In Step S4, heat the mold set 10 to cure the silica gel and form on the glass substrate 22 several silica-gel lenses 24 functioning as solar lenses, as shown in FIG. 3. After the injection-molding process, a robotic arm sucks the other side of the glass substrate 22 and takes out the product without damaging the silica-gel lenses 24.

Before the glass substrate 22 is placed in the receiving recess 16, an interfacial gel is applied on the glass substrate 22. The interfacial gel is a mixture of organic compounds containing silicon functional groups. The interfacial gel can increase the adhesiveness between the silica gel and the glass substrate 22.

The silica gel used in the present invention is a thermosetting material. The male mold has a cooling device and a heating device. When the silica-gel is injected into the mold set, the cooling device and heating device are used to maintain the temperature at 23° C. After injection is completed, the mold set is heated to a temperature of 100-200° C. to cure the silica gel. The female mold also has a heating device to moderate the temperature of the mold set and regulate the temperature of the glass substrate so that the silica gel contacting the glass substrate can cure firstly. Thereby, the entire fabrication process is completed within 60 seconds, and each cycle takes about 3 minutes.

Further, needle valves are arranged inside the cold runners to automatically shut off the cold runner when injection is completed, whereby the silica gel should not flow adversely. Besides, a vacuum pump is arranged on the male mold side and connected with the lens cavities. The vacuum pump is used to evacuate the mold cavities to favor silica gel injection. In one embodiment, the vacuum pump evacuates the mold cavities to have a pressure of 0.1 hpa.

In the present invention, the number of the lens cavities of the male mold can be adjusted according to requirements of the product and parameters of the machine, such as the capacity and injection pressure of the injection molding machine, whereby the products can be fabricated efficiently with reliable quality. In the present invention, each lens cavity has a tolerance of 0.2 mm.

In conclusion, the present invention proposes a multi-cavity injection molding method for fabricating solar lenses, which can fast mass-fabricate solar lenses having fine lens alignment and superior environment resistance.

The embodiments described above are only to exemplify the present invention but not to limit the scope of the present invention. Any equivalent modification or variation according to the characteristics or spirit of the present invention is to be also included within the scope of the present invention.

What is claimed is:

1. A multi-cavity injection molding method for fabricating solar lenses, comprising steps:
   step 1: providing a mold set including a female mold and a male mold corresponding to said female mold, wherein said female mold has a receiving recess, and wherein said male mold has several lens cavities each having a lens pattern and connected with a cold runner;
   step 2: placing a glass substrate inside said receiving recess;
   step 3: injecting a silica gel to all said lens cavities via said cold runners; and
   step 4: heating said mold set to cure said silica gel to form several silica-gel lenses on said glass substrate.

2. The multi-cavity injection molding method for fabricating solar lenses according to claim 1 further comprising a step of applying an interfacial gel on said glass substrate before said glass substrate is placed inside said receiving recess.

3. The multi-cavity injection molding method for fabricating solar lenses according to claim 1, wherein said step 3 is undertaken at an ambient temperature.

4. The multi-cavity injection molding method for fabricating solar lenses according to claim 1, wherein in said step 4, said mold set is heated to a temperature of over 100° C.

5. The multi-cavity injection molding method for fabricating solar lenses according to claim 4, wherein said female mold has a heating function, and said male mold has a cooling function and a heating function.

6. The multi-cavity injection molding method for fabricating solar lenses according to claim 1, wherein said lens pattern of said lens cavity is a lens pattern of a Fresnel lens.

7. The multi-cavity injection molding method for fabricating solar lenses according to claim 1, wherein said male mold has a vacuum pump connected with said lens cavities to assist in injecting said silica gel.

8. The multi-cavity injection molding method for fabricating solar lenses according to claim 7, wherein said vacuum pump evacuates said lens cavities to a pressure of 0.1 hpa.

9. The multi-cavity injection molding method for fabricating solar lenses according to claim 1, wherein said silica gel is injected by an injection rate of 143 cm/sec and a maximum injection pressure of 479 kg/cm$^2$.

10. The multi-cavity injection molding method for fabricating solar lenses according to claim 1, wherein said interfacial gel is a mixture of organic compounds containing silicon functional groups.

* * * * *